(12) United States Patent
Heo et al.

(10) Patent No.: US 8,338,559 B2
(45) Date of Patent: Dec. 25, 2012

(54) FLUORENE-BASED RESIN POLYMER AND METHOD FOR PREPARING THEREOF

(75) Inventors: Yoon-Hee Heo, Seoul (KR); Kyung-Soo Choi, Hanam-si (KR); Han-Soo Kim, Seoul (KR); Min-Young Lim, Daejeon (KR); Ji-Heum Yoo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 421 days.

(21) Appl. No.: 12/449,648

(22) PCT Filed: Jan. 21, 2008

(86) PCT No.: PCT/KR2008/000365
§ 371 (c)(1),
(2), (4) Date: Aug. 19, 2009

(87) PCT Pub. No.: WO2008/102953
PCT Pub. Date: Aug. 28, 2008

(65) Prior Publication Data
US 2010/0029892 A1 Feb. 4, 2010

(30) Foreign Application Priority Data
Feb. 20, 2007 (KR) .................. 10-2007-0017080

(51) Int. Cl.
*C08G 59/00* (2006.01)
*C08G 63/42* (2006.01)
(52) U.S. Cl. ......................... 528/97; 528/297
(58) Field of Classification Search .................. 528/297, 528/97
See application file for complete search history.

(56) References Cited

U.S. PATENT DOCUMENTS 6,379,590 B1 4/2002 Wu et al.

FOREIGN PATENT DOCUMENTS

| JP | 2001-196366 | | 7/2001 |
| JP | 2003-147074 A | | 5/2003 |
| JP | 2004-002635 | * | 1/2004 |
| JP | 2004-002636 | | 1/2004 |
| KR | 10-2001-0023832 | | 3/2001 |
| WO | WO 94/12910 A1 | | 6/1994 |
| WO | WO 99/12991 | | 3/1999 |

OTHER PUBLICATIONS

English language machine translation of JP 2004-002635. Original document published Jan. 2004. Printed Nov. 2011.*
Research Disclosure 399006. Articles comprising hydroxy-functional polyesters. Jul. 1997.*
Mang, Michael N. et al. Synthesis and properties of thermoplastic hydroxy-functional polyesters derived from diacids and diglycidyl ethers. Polymer Preprints. 36, 180. Dec. 1995.*

* cited by examiner

*Primary Examiner* — Mark Eashoo
*Assistant Examiner* — Megan McCulley
(74) *Attorney, Agent, or Firm* — McKenna Long & Aldridge LLP

(57) ABSTRACT

The present invention relates to a fluorene-based resin polymer having a repeating unit of Formula 1 and a method for preparing the same. The fluorene-based resin polymer has a high molecular weight and low acid value, and has an excellent developing property, adhesive property, and stability.

8 Claims, 3 Drawing Sheets

FLUORENE-BASED RESIN POLYMER AND METHOD FOR PREPARING THEREOF

This application claims the benefit of PCT/KR2008/000365 filed on Jan. 21, 2008 and Korean Patent Application No. 10-2007-0017080 filed on Feb. 20, 2007, both of which are hereby incorporated herein by reference for all purposes in their entirety.

TECHNICAL FIELD

The present invention relates to a fluorene-based resin polymer and a method for preparing the same. This application claims priority from Korean Patent Application No. 10-2007-17080 filed on Feb. 20, 2007 in the KIPO, the disclosure of which is incorporated herein by reference in its entirety.

BACKGROUND ART

In general, a fluorene-based resin is a structure prepared by a condensation reaction of a diol compound containing a fluorene group and acid dianhydride. Thus, the fluorene-based resin is hardly prepared to be a polymer having a low acid value and high molecular weight.

In the case where such fluorene-based resin is used for a negative-type photosensitive resin composition, the negative-type photosensitive resin composition has a good adhesive property to a substrate. However, there is a problem in that it has a high acid value and low molecular weight, thereby being weak during developing process.

DISCLOSURE OF INVENTION

Technical Problem

Accordingly, in order to solve the above problems, it is an object of the present invention to provide a fluorene-based resin polymer having a low acid value and high molecular weight while maintaining an excellent adhesive property to a substrate, and a method for preparing the same.

Technical Solution

In order to achieve the object, the present invention provides a fluorene-based resin polymer having a repeating unit of the following Formula 1.

wherein X is one selected from the group consisting of alkylene having 1 to 3 carbon atoms, ethylene oxide and propylene oxide, and Y is one selected from the group consisting of cyclohexane, cyclohexene, benzene and alkylene having 3 to 10 carbon atoms.

Further, the present invention provides a method for preparing a fluorene-based resin polymer, in which a diepoxy compound containing a fluorene group and a diacid compound, which has such a structure that both ends of one selected from benzene, cyclohexane, cyclohexene, norbornene and alkane having 3 to 10 carbon atoms are substituted with two acids, are mixed, and then subjected to a condensation reaction to give a fluorene-based resin polymer having a repeating unit of Formula 1.

Advantageous Effects

The fluorene-based resin polymer according to the present invention has a high molecular weight and low acid value, and has an excellent developing property, adhesive property, and stability.

BEST MODE FOR CARRYING OUT THE INVENTION

Figure 1:
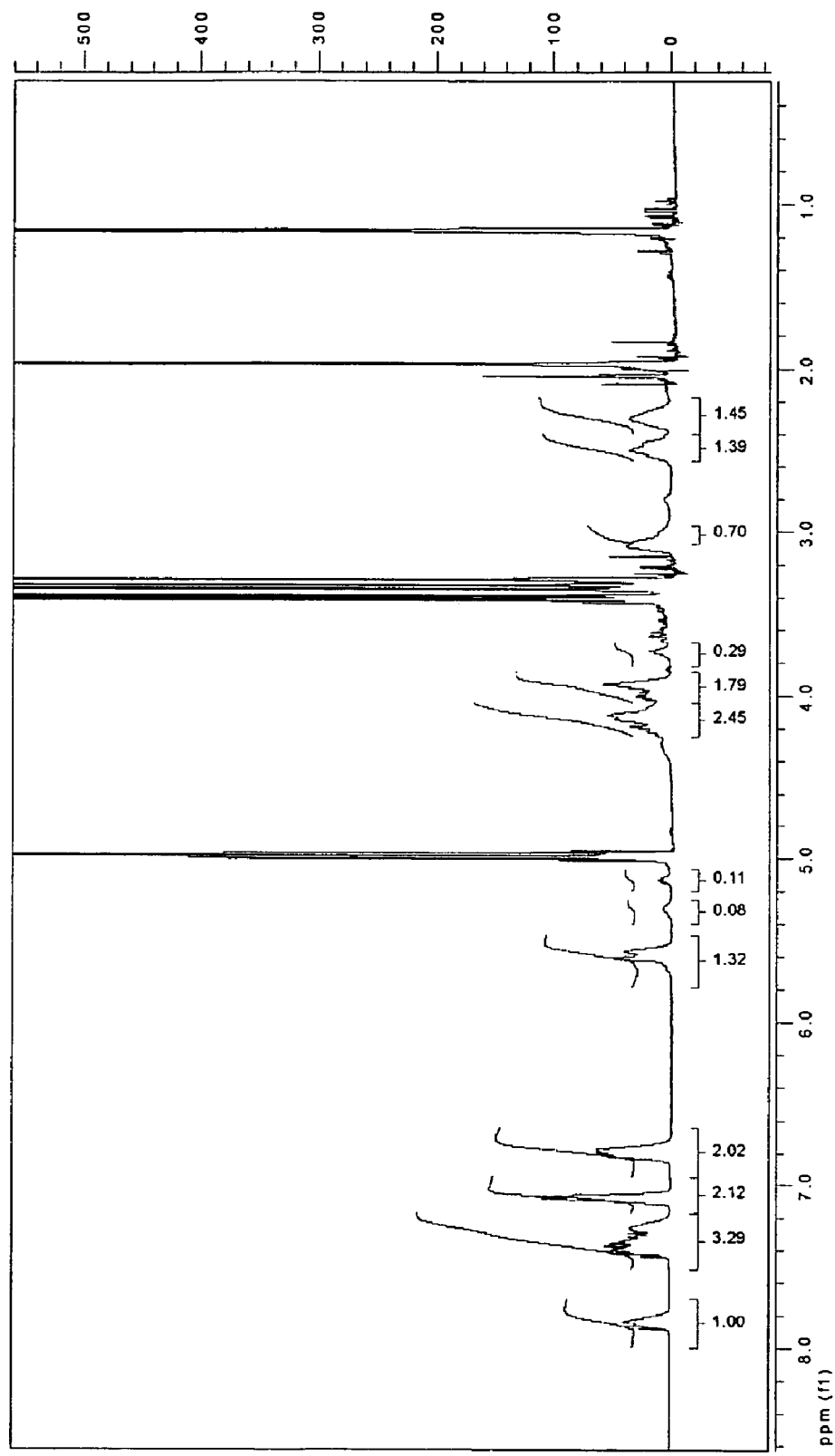
FIG. 1 is an NMR graph of Example 1.

Hereinafter, the present invention will be described in detail.

Formula 1 can be represented by the following Formula 2, for example, when X is methylene, and Y is cyclohexane.

[Formula 1]

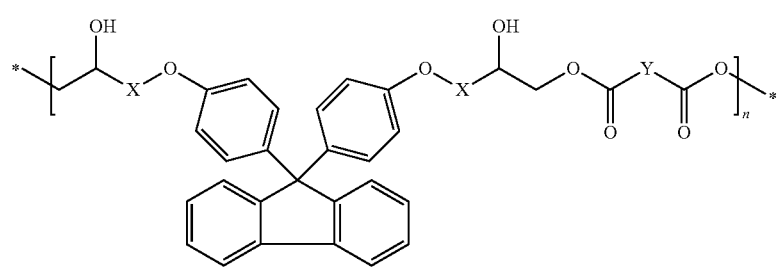

[Formula 2]

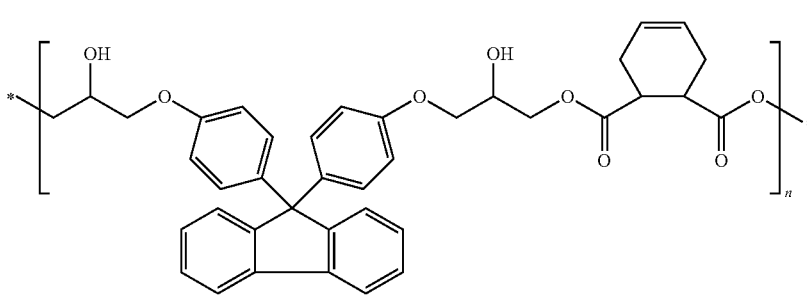

The fluorene-based resin polymer can be prepared by mixing a) a diepoxy compound containing a fluorene group and b) a diacid compound, which has such a structure that both ends of one selected from benzene, cyclohexane, cyclohexene, norbornene and alkane having 3 to 10 carbon atoms are substituted with two acids, and subjecting to a condensation reaction.

A known fluorene-based resin polymer is prepared by the reaction of diol compound and acid dianhydride. Therefore, as the resulting polymer has a higher molecular weight, the polymer having a higher acid value is prepared. Accordingly, the known fluorene-based resin polymer having a high molecular weight is suitably used for a negative-type photosensitive composition. Meanwhile, as the diol group and acid dianhydride group are reacted with each other, more acidic groups are generated, which exceedingly increases its acid value. Consequently, there are problems in the compatibility with other compounds in the negative-type photosensitive resin composition or developing property.

Accordingly, in order to improve the above problems, the present inventor has prepared a novel fluorene-based resin polymer having a high molecular weight and low acid value, in which a diepoxy compound and diacid compound are subjected to reaction to prevent acidic groups from generating.

In order to increase the molecular weight of a polymer prepared by the condensation reaction, two monomers involved in the reaction are generally used in a ratio of about 1:1, and allowed to react with each other under the optimal conditions such as catalyst and temperature for 100% reaction.

However, in the preparation of the known fluorene-based resin polymer, the ratio of acid dianhydride to diol compound is 1:0.8. It is because that if the reaction proceeds too much, the molecular weight and acid value increase. That is, if its acid value becomes 120 or more, the photosensitive composition is not preferable. Further, acid dianhydride does not have a good solubility in the reaction solvent, for example, PGMEA (Propylene Glycol Methyl Ether Acetate). Therefore, if the ratio is 0.8 or more, acid dianhydride does not completely react and remains as a white solid.

Meanwhile, in the preparation of the fluorene-based resin polymer according to the present invention, even if its molecular weight increases, its acid value does not increases. Thus, it is possible to increase its molecular weight as desired. Further, since the epoxy compound and diacid compound have a good solubility, the reaction ratio of two compounds can be increased to give a binder resin having a high molecular weight.

In the preparation of the known fluorene-based resin polymer, acid dianhydride used in the reaction remains in a small amount, even after completion of the reaction, which problematically reduces the stability of the negative-type photosensitive resin composition containing the residual acid dianhydride.

On the contrary, in the preparation of the fluorene-based resin polymer according to the present invention, no anhydride group is used, and thus the resulting fluorene-based resin polymer itself is stable, and the negative-type photosensitive resin composition containing the same also has a good stability.

Further, when the known fluorene-based resin polymer is used for the negative-type photosensitive resin composition, the fluorene-based resin polymer has a higher acid value relative to a low molecular weight, for example, an acid value of about 120 relative to a molecular weight of about 4,000 to 7,000 g/mol, whereby the developing property can not be easily controlled, and a bottom portion of the pattern is problematically scraped during developing process.

On the contrary, when the fluorene-based resin polymer according to the present invention is used for the negative-type photosensitive resin composition, the fluorene-based resin polymer according to the present invention has a low acid value and a higher molecular weight than the known fluorene-based resin. Thus, the suitable developing property can be achieved.

Further, in the case of using the fluorene-based resin polymer of the present invention, it is possible to improve the scraping of the bottom portion of the pattern occurring in the developing process after exposure. The scraping of the bottom portion of the pattern refers that the bottom portion of the pattern is scraped by a developing solution, undergoes post-bake step, and then the top portion of the pattern subsides to make a staircase-type pattern. Further, the fluorene-based resin polymer according to the present invention has an adhesive property to a substrate, which is an advantage of the fluorene-based compound, and also has a good developing property. Thus, its adhesive property during developing process is excellent. In this connection, the adhesive property during developing process refers to a property that the pattern is attached to the substrate while undergoing the developing process. Generally, it has been known that the fluorene-based compound is well attached to the substrate during developing process, as compared to other compounds. The known polymer made of such fluorene-based compound is well attached to the substrate. However, due to its high acid value, there is a problem in that the bottom portion of the pattern is scraped.

As described above, the present invention has focused on the synthesis of the fluorene-based resin polymer having an excellent adhesive property to the substrate, a high molecular weight and low acid value, and an improved developing property and stability.

The fluorene-based resin polymer according to the present invention is polymerized by using a diepoxy compound containing a fluorene group, which can be represented by the following Formula 3.

[Formula 3]

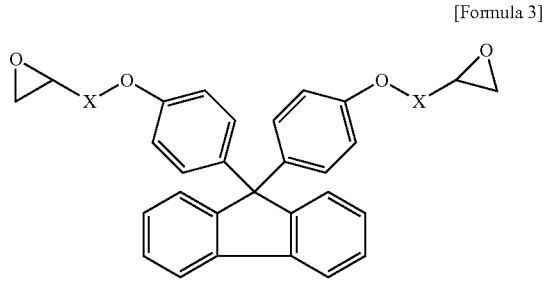

wherein X is one selected from the group consisting of alkylene having 1 to 3 carbon atoms, ethylene oxide and propylene oxide.

For example, in the case where X in Formula 3 is propylene oxide, it can be represented by the following Formula 4.

[Formula 4]

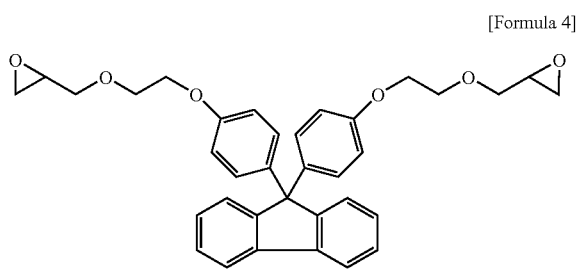

Further, the fluorene-based resin polymer according to the present invention is polymerized by using a diacid compound, which has such a structure that both ends of one selected from benzene, cyclohexane, cyclohexene, norbornene and alkane having 3 to 10 carbon atoms are substituted with two acids, and preferably has a compound having a cyclic group to improve an adhesive property during developing process.

Examples of the diacid compound preferably include cis-4-cyclohexene-1,2-dicarboxylic acid, cis-5-norbornene-endo-2,3-dicarboxylic acid, succinic acid, isophthalic acid, phthalic acid, 1,2-cyclohexanedicarboxylic acid, 1,2-phenylene diacetic acid, 1,2-phenylene dioxy diacetic acid, and 1,4-cyclohexanedicarboxylic acid, which can be represented by the following compounds.

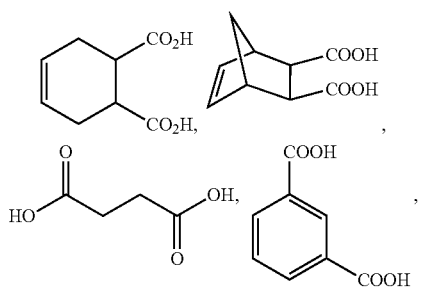

-continued

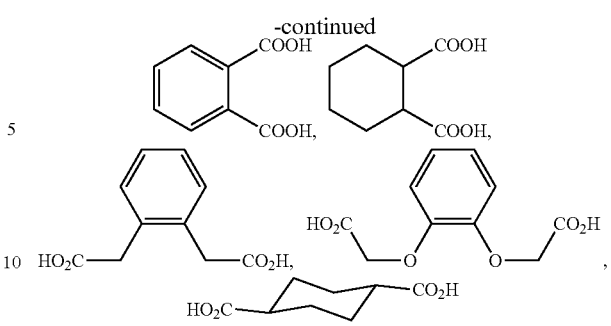

The fluorene-based resin polymer according to the present invention preferably has a weight-average molecular weight of 1,000 to 50,000.

Further, the present invention provides a method for preparing a fluorene-based resin polymer, in which a diacid compound, which has such a structure that both ends of one selected from benzene, cyclohexane, cyclohexene, norbornene and alkane having 3 to 10 carbon atoms are substituted with two acids, and a diepoxy compound containing a fluorene group are mixed, and then subjected to a condensation reaction to give a fluorene-based resin polymer having a repeating unit of Formula 1. The present invention can be performed by the condensation reaction known in the related art.

A negative-type photosensitive resin composition comprising the fluorene-based resin polymer as an alkali soluble resin can be prepared.

The negative-type photosensitive resin composition may conventionally contain an alkali soluble resin, a polymerizable compound having an ethylenic unsaturated bond, a photopolymerization initiator, and a solvent, but is not limited thereto.

It is preferable that the negative-type photosensitive resin composition is used for a photosensitive material for a color filter, a photosensitive material for an overcoat or a column spacer.

MODE FOR THE INVENTION

Hereinafter, the present invention will be described in detail with reference to Examples of the present invention. Examples of the present invention may be modified in many different forms and should not be construed as being limited to Examples set forth herein. Rather, Examples of the present invention are provided so that this disclosure will be thorough and complete and will fully convey the concept of the present invention to those skilled in the art.

Example 1

Synthesis of Fluorene-Based Resin Polymer 122 g of 9,9-bisphenolfluorenediglycidylether and 45 g of 4-cyclohexene-1,2-dicarboxylic acid were stirred with 150 g of propyleneglycol methyl ether acetate. While supplying nitrogen into a reactor, the reactor was heated to 110° C. After 10 hours, the reaction was completed, and 200 g of reaction solvent was added to give a fluorene-based resin polymer. The result is shown in an NMR graph of FIG. 1 (solid content: 29.19% by weight, acid value: 25, molecular weight: 13000).

Example 2

Figure 2:
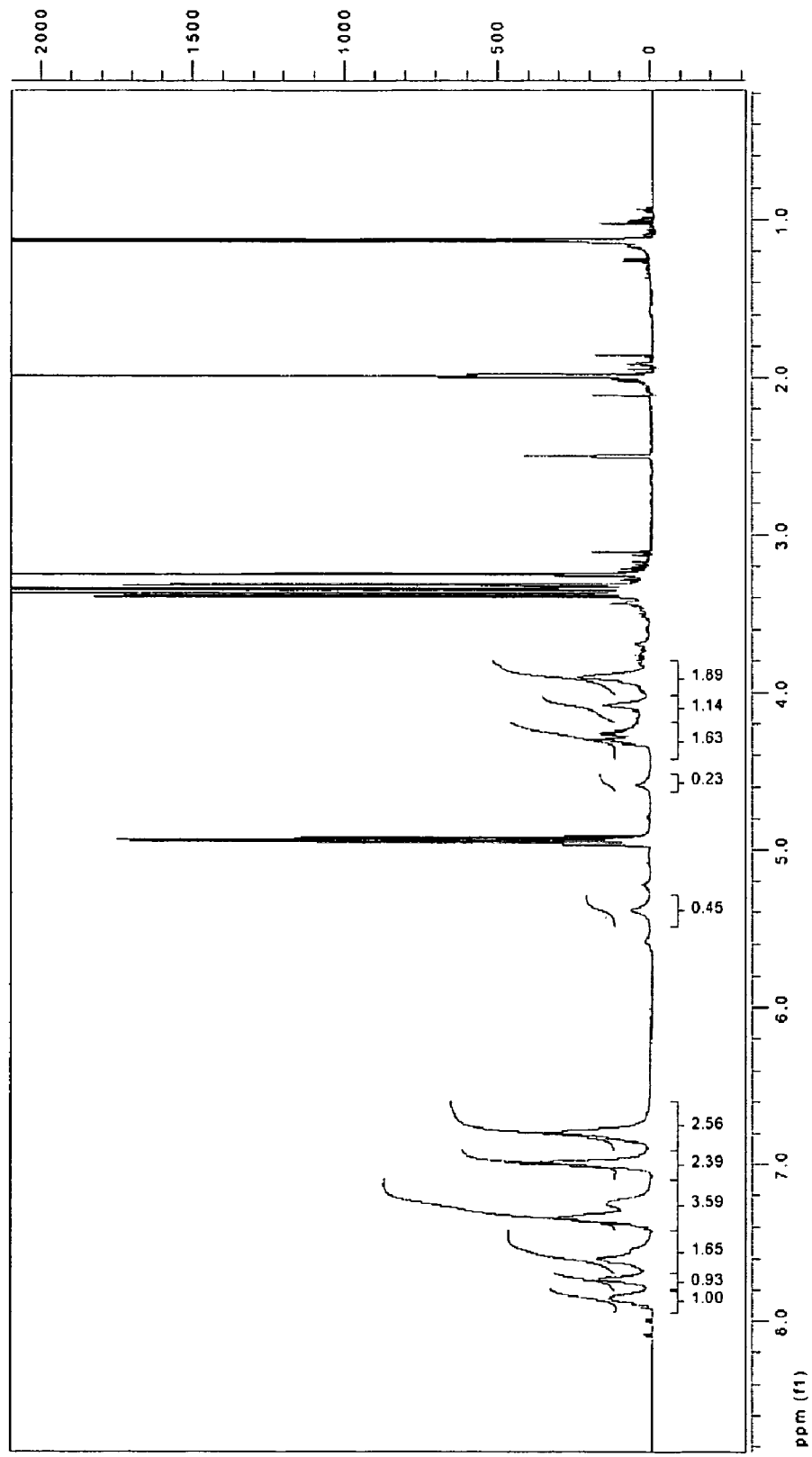
FIG. 2 is an NMR graph of Example 2.

124 g of 9,9-bisphenolfluorenediglycidylether and 44 g of phthalic acid were stirred with 150 g of propyleneglycol methyl ether acetate. While supplying nitrogen into a reactor, the reactor was heated to 110° C. After 10 hours, the reaction was completed, and 200 g of reaction solvent was added to give a fluorene-based resin polymer. The result is shown in an NMR graph of FIG. 2 (solid content: 28.80% by weight, acid value: 32, molecular weight: 10300).

Example 3

Figure 3:
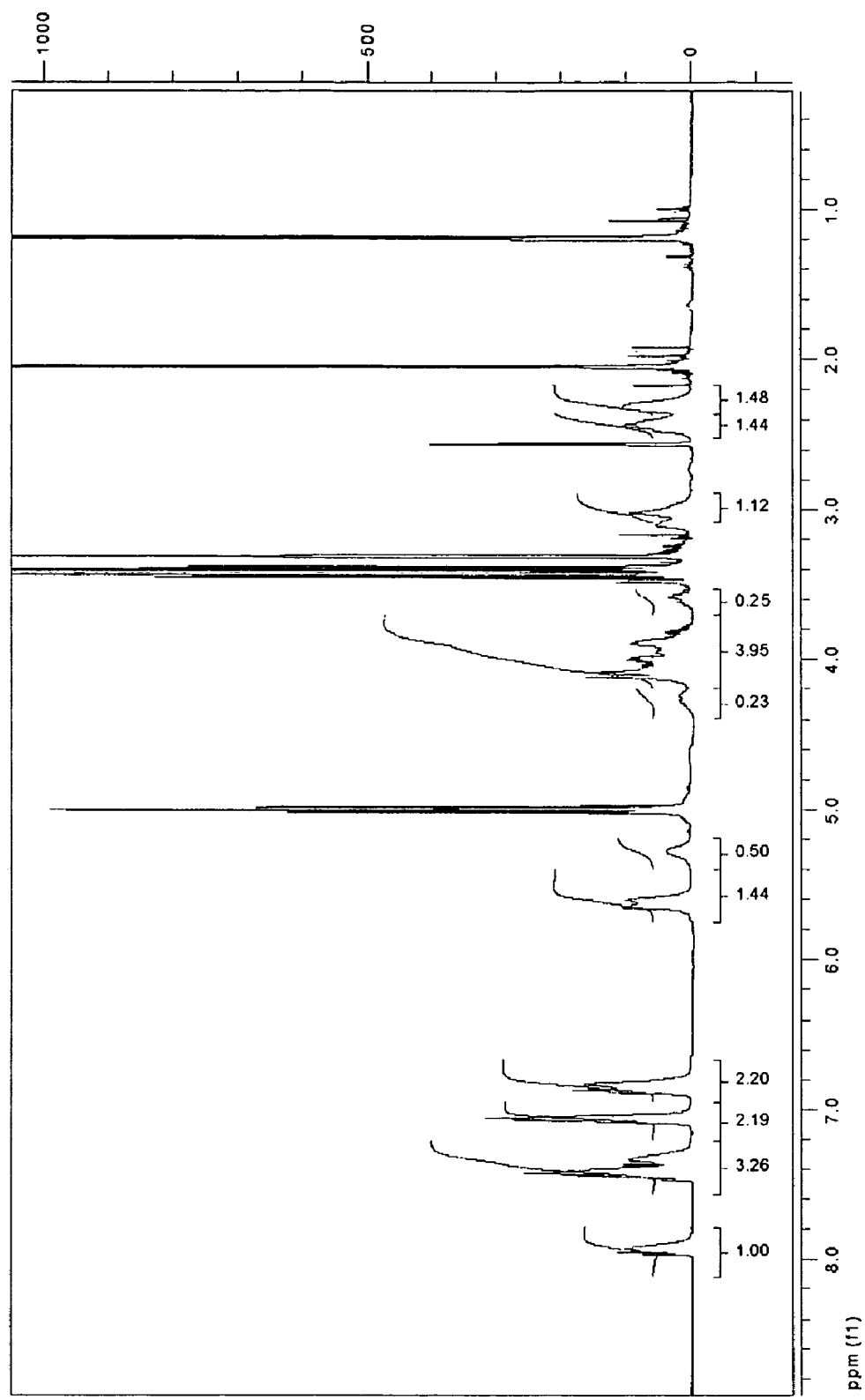
FIG. 3 is an NMR graph of Example 3.

107 g of 9,9-bisphenolfluorenediglycidylether and 42 g of 5-norbornene-2,3-dicarboxylic acid were stirred with 150 g of propyleneglycol methyl ether acetate. While supplying nitrogen into a reactor, the reactor was heated to 110° C. After 10 hours, the reaction was completed, and 200 g of reaction solvent was added to give a fluorene-based resin polymer. The result is shown in an NMR graph of FIG. 3 (solid content: 31.65% by weight, acid value: 25, molecular weight: 4000).

The invention claimed is:

1. A fluorene-based resin polymer having a repeating unit of the following Formula 1:

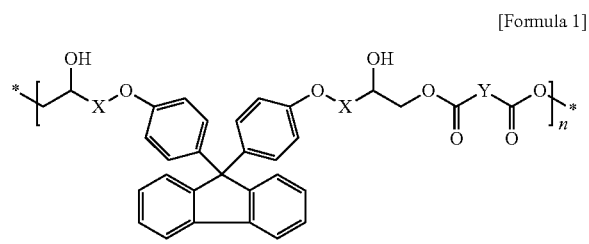

[Formula 1]

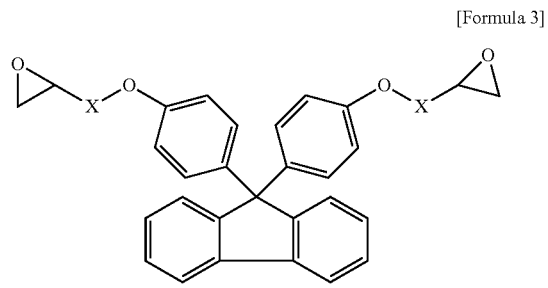

[Formula 3]

wherein X is one selected from the group consisting of alkylene having 1 to 3 carbon atoms, ethylene oxide and propylene oxide.

4. The fluorene-based resin polymer according to claim 3, wherein the diacid compound contains at least one compound selected from the group consisting of cis-4-cyclohexene-1,2-dicarboxylic acid and cis-5-norbornene-endo-2,3-dicarboxylic acid.

5. A method for preparing a fluorene-based resin polymer, wherein a diepoxy compound containing a fluorene group; and a diacid compound, which has such a structure that both ends of one selected from cyclohexene and norbornene are substituted with two acids, are mixed, and then subjected to a condensation reaction to give a fluorene-based resin polymer having a repeating unit of Formula 1:

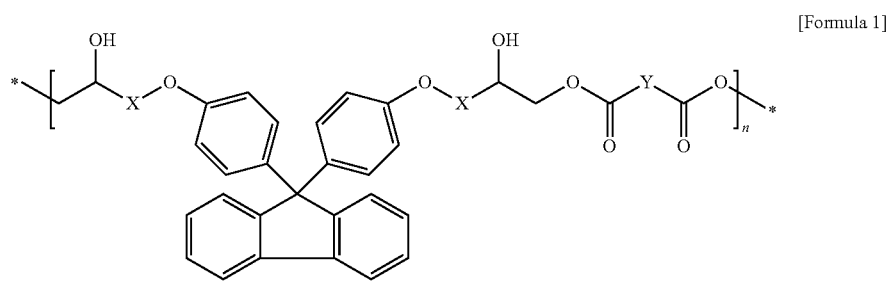

[Formula 1]

wherein X is one selected from the group consisting of alkylene having 1 to 3 carbon atoms, ethylene oxide, and propylene oxide, and Y is one selected from the group consisting of cyclohexene and norbornene.

2. The fluorene-based resin polymer according to claim 1, wherein the fluorene-based resin polymer has a weight-average molecular weight of 1,000 to 50,000.

3. The fluorene-based resin polymer according to claim 1, wherein the fluorene-based resin polymer is prepared by a condensation-reaction of
   a) a diepoxy compound containing a fluorene group represented by the following Formula 3; and
   b) a diacid compound having such a structure that both ends of one selected from cyclohexene and norbornene and alkane having 3 to 10 carbon atoms are substituted with two acids:

wherein X is one selected from the group consisting of alkylene having 1 to 3 carbon atoms, ethylene oxide, and propylene oxide, and Y is one selected from the group consisting of cyclohexene and norbornene.

6. The method for preparing a fluorene-based resin polymer according to claim 5, wherein the fluorene-based resin polymer has a weight-average molecular weight of 1,000 to 50,000.

7. The method for preparing a fluorene-based resin polymer according to claim 5, wherein the diepoxy compound containing a fluorene group is represented by the following Formula 3:

[Formula 3]

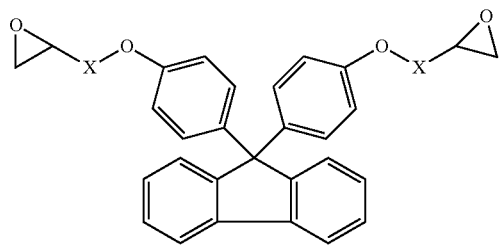

wherein X is one selected from the group consisting of alkylene having 1 to 3 carbon atoms, ethylene oxide and propylene oxide.

8. The method for preparing a fluorene-based resin polymer according to claim 5, wherein the diacid compound is at least one selected from the group consisting of cis-4-cyclohexene-1,2-dicarboxylic acid and cis-5-norbornene-endo-2,3-dicarboxylic acid.

* * * * *